United States Patent [19]

Kawashima et al.

[11] 4,330,631
[45] May 18, 1982

[54] DIELECTRIC CERAMICS

[75] Inventors: Syunichiro Kawashima, Nishinomiya; Masamitsu Nishida; Ichiro Ueda, both of Osaka; Hiromu Ouchi, Toyonaka, all of Japan

[73] Assignee: Matsushita Electric Industrial Co., Ltd., Osaka, Japan

[21] Appl. No.: 277,003

[22] Filed: Jun. 24, 1981

[30] Foreign Application Priority Data

Jul. 1, 1980 [JP] Japan .................................. 55-90260

[51] Int. Cl.³ ....................... C04B 35/46; C04B 35/50
[52] U.S. Cl. ..................................................... 501/139
[58] Field of Search ................................ 501/139, 152

[56] References Cited

U.S. PATENT DOCUMENTS 3,586,642 6/1971 Matsuo et al. ....................... 501/139
3,764,529 10/1973 Matsuo et al. ....................... 501/139
3,938,064 2/1976 O'Bryan ............................... 501/137
4,014,707 3/1977 Tanaka et al. ....................... 501/139

*Primary Examiner*—O. R. Vertiz
*Assistant Examiner*—Mark Bell
*Attorney, Agent, or Firm*—Stevens, Davis, Miller, Mosher

[57] ABSTRACT

A dielectric ceramic consisting essentially of a solid solution represented by the formula:

$$xBaO-yTiO_2-zSm_2O_3$$

wherein $5 \leq x \leq 23$, $57 \leq y \leq 82.5$, $2.5 \leq z \leq 37.5$, and $x+y+z=100$.

The dielectric ceramic exibits large dielectric constant and low microwave loss with high temperature-stability in resonant frequency and is suitable for use as dielectric resonators, electrical filters, substrates and other uses.

1 Claim, No Drawings

DIELECTRIC CERAMICS

This invention relates to a dielectric ceramic. More particularly, this invention relates to a dielectric ceramic consisting of BaO, $TiO_2$ and $Sm_2O_3$.

In the domain of microwave, dielectrics have hitherto been used for matching impedance of microwave circuits, or as a dielectric resonator, or for some other uses. Recently, particularly with the progress in the integration of microwave circuits, it is positively advanced to use dielectric ceramics having high dielectric constant and giving low dielectric loss in resonators, bandpass filters and the like and thereby miniaturizing these apparatuses.

As a dielectric material suitable for these uses, a BaO-$TiO_2$ type ceramic, a ceramic obtainable by partially replacing it with another element or a dielectric material obtainable by combining $TiO_2$ having a negative temperature coefficient of dielectric constant with a dielectric ceramic or glass having a positive temperature coefficient of dielectric constant in order to control said temperature coefficient has hitherto been used in many cases. However, these materials have many practical problems such as small dielectric constant, large dielectric loss, difficult of obtaining a product having the desired temperature coefficient when used as a dielectric resonator, and so on.

The present inventors conducted various studies on dielectric materials not having these drawbacks. As the result, it was found that a ceramic having a composition represented by the following general formula:

$$xBO - yTiO_2 - zSm_2O_3$$

wherein x, y and z fall in the following ranges as expressed by percentage by mole:

$$5 \leq x \leq 23,$$

$$57 \leq y \leq 82.5,$$

and $$2.5 \leq z \leq 37.5$$

$$(x+y+z=100)$$

can be used as an excellent dielectric ceramic for high frequency.

The object of this invention consists in providing a dielectric ceramic composition which has a high dielectric constant ($\epsilon_r$) and gives a small dielectric loss (1/Q), of which the dielectric constant has a linear temperature dependency, and of which the temperature coefficient can be varied in a wide range by changing the composition ratio in accordance with use.

Hereunder, this invention will be explained with reference to an example.

EXAMPLE

As starting materials, $BaCO_3$, $TiO_2$, and $Sm_2O_3$ all having a chemically high purity were weighed out according to the predetermined composition ratio shown in the following table and mixed together with pure water in a rubber-lined ball mill having agate balls. The mixture was taken out of the ball mill, dried and then calcined for 2 hours at a temperature of 900° C. in the presence of air.

The calcined product was pulverized together with pure water in the same ball mill as above. The pulverized slurry was dehydrated and dried to give a powder. The powder was uniformly mixed with 8% by weight of a solution of polyvinyl alcohol having a concentration of 3% as a binder and then passed through a 32 mesh sieve for the sake of grain dressing. The grain-dressed powder was formed into a circular board having a diameter of 20 mm and a thickness of about 10 mm by means of a die and an oil press under a molding pressure of 800 kg/cm². The molded product was placed in an alumina crucible made of high purity alumina, and fired in the presence of air by maintaining the temperature in the range of 1,250°–1,550° C. for 1–2 hours, provided that the conditions of firing were varied in accordance with the composition. Thus, the dielectric ceramics having the compositions shown in the following table were obtained. Using the ceramic elements thus obtained, resonance frequency, unloaded Q and dielectric constant ($\epsilon_r$) were determined by measurement according to the dielectric resonator method. The temperature coefficient ($\tau_k$ ppm/°C.) of dielectric constant ($\epsilon_r$) was determined from the values in the temperature range of −40° C. to +80° C. In these measurements, the resonance frequency was 2–4 GHz. The results of the experiments are summarized in the following table.

TABLE

| Sample No. | Composition (% by mole) | | | Firing temperature (°C.) | Dielectric constant $\epsilon_r$ | Unloaded Q | Temperature coefficient $\tau_k$ (ppm/°C.) |
| --- | --- | --- | --- | --- | --- | --- | --- |
| | x | y | z | | | | |
| 1 | 23 | 57 | 20 | 1425 | 51 | 520 | 485 |
| 2 | 20.5 | 77 | 2.5 | 1300 | 47 | 3370 | −57 |
| 3 | 20 | 60 | 20 | 1450 | 47 | 1940 | −433 |
| 4 | 17 | 69 | 14 | 1300 | 84 | 2300 | 8 |
| 5 | 15 | 82.5 | 2.5 | 1300 | 50 | 610 | −150 |
| 6 | 14.3 | 71.4 | 14.3 | 1300 | 77 | 2950 | −49 |
| 7 | 14.7 | 67.7 | 17.6 | 1300 | 81 | 2070 | 28 |
| 8 | 13 | 82 | 5 | 1300 | 56 | 540 | −220 |
| 9 | 10 | 62 | 28 | 1500 | 55 | 520 | −650 |
| 10 | 5 | 57.5 | 37.5 | 1550 | 32 | 330 | −360 |
| 11* | 42 | 56 | 2 | 1400 | 1530 | Unmeasurable** | Unmeasurable** |
| 12* | 4 | 94 | 2 | 1350 | 76 | Unmeasurable** | Unmeasurable** |

TABLE-continued

| Sample No. | Composition (% by mole) | | | Firing temperature (°C.) | Dielectric constant $\epsilon_r$ | Unloaded Q | Temperature coefficient $T_k$ (ppm/°C.) |
| --- | --- | --- | --- | --- | --- | --- | --- |
| | x | y | z | | | | |
| 13* | 4 | 54 | 42 | 1550 | 24 | Unmeasurable** | Unmeasurable** |

Notes
(1) *: Comparative examples out of the scope of this invention.
(2) **: Unmeasurable because of low Q value.
(3) The dielectric constants of the sample Nos. 11–13 were measured at 1 MHz.

In the table, the samples marked with * are comparative examples out of the scope of this invention, and the other samples are examples which are in the scope of this invention. That is, if the amount of BaO (x) is larger than 23% by mole or the amount of $TiO_2$ (y) is larger than 57% by mole or the amount of $Sm_2O_3$ (z) is smaller than 2.5% by mole, unloaded Q is so low as to be unmeasurable and, in addition, the temperature coefficient of dielectric constant is also unmeasurable. If the amount of BaO (x) is smaller than 5% by mole or the amount of $TiO_2$ (y) is smaller than 82.5% by mole or the amount of $Sm_2O_3$ (z) is larger than 37.5% by mole, unloaded Q similarly drops to become unmeasurable. Accordingly, the above-mentioned scopes are excepted from the scope of this invention.

As is apparent from the description given above, the dielectric ceramic composition according to this invention exhibits a large Q value in the microwave region and has a large dielectric constant. Further, since the temperature coefficient of dielectric constant can be selected from a wide range by changing its composition, it has great merit as a circuit element for temperature compensation. Thus, it is a material of high industrial usefulness.

What is claimed is:

1. A dielectric ceramic composition consisting of barium oxide, titanium oxide and samarium oxide characterized in that, when its composition formula is represented by $xBaO-yTiO_2-zSm_2O_3$, its ingredient composition represented in terms of percentage by mole falls in the following range:

$$5 \leq x \leq 23,$$

$$57 \leq y \leq 82.5$$

and $$2.5 \leq z \leq 37.5,$$

provided that $x + y + z = 100$.

* * * * *